(12) United States Patent
Mori et al.

(10) Patent No.: US 9,603,290 B2
(45) Date of Patent: Mar. 21, 2017

(54) SHIELD UNIT AND METHOD OF MANUFACTURING SAME

(71) Applicant: Yazaki Corporation, Tokyo (JP)

(72) Inventors: Shigeo Mori, Kakegawa (JP); Takashi Ishihara, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 15/075,776

(22) Filed: Mar. 21, 2016

(65) Prior Publication Data

US 2016/0205815 A1    Jul. 14, 2016

Related U.S. Application Data

(63) Continuation of application No. PCT/JP2014/078232, filed on Oct. 23, 2014.

(30) Foreign Application Priority Data

Oct. 25, 2013    (JP) .................................. 2013-221768

(51) Int. Cl.
| | |
|---|---|
| *H05K 9/00* | (2006.01) |
| *H01R 13/6592* | (2011.01) |
| *H01R 43/18* | (2006.01) |
| *H01R 43/048* | (2006.01) |

(52) U.S. Cl.
CPC ....... *H05K 9/0018* (2013.01); *H01R 13/6592* (2013.01); *H01R 43/048* (2013.01); *H01R 43/18* (2013.01)

(58) Field of Classification Search
CPC .......................... H05K 9/0018; H01R 13/6592
See application file for complete search history.

(56) References Cited

U.S. PATENT DOCUMENTS

| | | | |
|---|---|---|---|
| 7,695,320 B2 * | 4/2010 | Tsukashima | ........... H01R 9/032 439/607.44 |
| 9,461,414 B2 * | 10/2016 | Yanagihara | .......... H05K 9/0018 |
| 9,462,730 B2 * | 10/2016 | Iizuka | .................. H05K 9/0018 |
| 2002/0157843 A1 | 10/2002 | Fukushima et al. | |

(Continued)

FOREIGN PATENT DOCUMENTS

| | | |
|---|---|---|
| JP | 2002-324627 A | 11/2002 |
| JP | 2002-329557 A | 11/2002 |

(Continued)

OTHER PUBLICATIONS

International Search Report for PCT/JP2014/078232 dated Jan. 13, 2015.

*Primary Examiner* — Hung V Ngo
(74) *Attorney, Agent, or Firm* — Sughrue Mion, PLLC

(57) ABSTRACT

A first plate of a shield shell includes a flat plate member and at least one crimping piece extending from an outer circumferential edge of the flat plate member and folded back to one surface of the flat plate member in a penetrating direction of a first through hole. A second plate of the shield shell piled on the flat plate member with a developed portion of a shield member held by and between the flat plate member and the second plate is crimped and fixed to the one surface of the flat plate member by a tip end of the crimping piece. A tabular portion of the shield member passes through the first through hole or a second through hole and extends out of the shield shell.

4 Claims, 10 Drawing Sheets

(56) References Cited

U.S. PATENT DOCUMENTS

| | | | |
|---|---|---|---|
| 2005/0208798 A1* | 9/2005 | Shimoda | B60L 11/1803 |
| | | | 439/98 |
| 2005/0266729 A1 | 12/2005 | Fukushima et al. | |
| 2009/0126987 A1* | 5/2009 | Gladd | H01R 13/658 |
| | | | 174/393 |
| 2009/0145655 A1* | 6/2009 | Gladd | H05K 9/0098 |
| | | | 174/378 |
| 2014/0238735 A1* | 8/2014 | Adachi | H01R 4/20 |
| | | | 174/351 |

FOREIGN PATENT DOCUMENTS

| | | |
|---|---|---|
| JP | 2005-339933 A | 12/2005 |
| JP | 2006-260985 A | 9/2006 |

* cited by examiner

SHIELD UNIT AND METHOD OF MANUFACTURING SAME

CROSS REFERENCE TO RELATED APPLICATION

This application is a Continuation of PCT Application No. PCT/JP2014/078232, filed on Oct. 23, 2014, and claims the priority of Japanese Patent Application No. 2013-221768, filed on Oct. 25, 2013, the content of both of which is incorporated herein by reference.

BACKGROUND

Technical Field

The disclosure relates to a shield unit configured by connecting a shield shell to an opening end of a shield member.

Related Art

A, shield cable for an electric vehicle (EV), a hybrid electric vehicle (REV), and the like dealing with high voltage is provided with a shield unit to be electrically connected to shield case. This shield unit includes a shield member made of a braided wire or the like covering an electric cable bundle and a shield shell connected to an opening end of the shield member. When the shield shell is fixed, to the grounded shield case, the shield member is electrically connected to the shield case via the shield shell, and the electric cable bundle covered with the shield member functions as the shield cable shielding against noise.

For connection between the shield member and the shield shell, a method of covering a tubular portion provided in the shield shell with an end portion of the shield member and swaging and fixing a swage ring over the end portion is often used. Also, to enhance fixation of the shield member, Japanese Unexamined Patent Application Publication No. 2005-339933 describes that a tightening belt is fitted over the shield member and is tightened by a bolt to reduce the diameter of the shield member. Further, to enhance fixation of the shield member, Japanese Unexamined Patent Application Publication No. 2002-324627 describes that a band-shaped clamp attached to the tubular portion of the shield shell over the shield member is welded to the tubular portion of the shield shell together with the shield member.

SUMMARY

In any of the aforementioned connecting methods, the shield shell needs to be provided, with the tubular portion by means of drawing or the like in addition to a part to be attached to the shield case. The configuration of the shield shell is complicated as much as providing this tubular portion, and part cost and manufacturing cost increase.

Also, the swage ring, the tightening belt, the band-shaped clamp, and the like used to fix the shield member to the tubular portion are annular parts requiring drawing in a similar manner to the tubular portion of the shield member, and the part cost increases.

Further, in the connecting method of welding the clamp to the tubular portion of the shield shell, the temperature of the shield shell, the shield member, and the like that has raised due to the welding needs to be lowered, and the manufacturing cost further increases as much as the time and facilities added to the manufacturing process for the cooling.

An object of the disclosure is to provide a shield unit enabling an end portion of a shield member to be attached and fixed to a shield shell with inexpensive parts and a simple manufacturing process in attaching the shield member to the shield shell to constitute the shield unit, and a method of manufacturing the same.

A shield unit in accordance with some embodiments includes: a tubular shield member having a tubular portion and a developed, portion extending from the tubular portion and developed outward in a radial direction of the tubular portion; and a shield shell connected to the developed portion and comprising a first plate and a flat second plate. The first plate includes: a flat plate member having a first through hole at a center of the flat plate; and at least one crimping piece extending from an outer circumferential edge of the flat plate member and folded back to one surface of the flat plate member in a penetrating direction of the first through hole. The second plate has a second through hole at a center of the second plate. The developed portion is held by and between the flat plate member and the second plate piled with the first through hole and the second, through hole being aligned. The second plate piled on the flat plate member with the developed portion held by and between the flat plate member and the second plate is crimped and fixed to the one surface of the flat plate member by a tip end of the crimping piece. The tubular portion passes through the first through hole or the second through hole and extends out of the shield shell.

According to the above configuration, the developed portion of the shield member is held by and between the flat plate member and the second plate of the shield shell. The tubular portion extending from the developed portion held by and between the flat plate member and the second plate is pulled out of (passes through) the first or second through hole and extends out of the shield shell.

In this state, an inside of the shield member communicates with an outside of the shield shell via the through hole of the plate, which is the counterpart of the plate having the first or second through hole through which the tubular portion of the shield member has been pulled out. Accordingly, when this plate is attached to a shield case, a shield cable in the shield member is ready for being connected to a cable of the shield case.

Consequently, it is not necessary to provide the shield shell with a, tubular portion for connecting the shield member and to use an annular member such as a swage ring for attaching the shield member to the tubular portion of the shield shell. Accordingly, in attaching the shield member to the shield shell, the developed portion, which is an end portion of the shield, member, can be attached and fixed to the shield shell with inexpensive parts and a simple manufacturing process.

A folded back portion of the crimping piece extending from the tip end may have an arc shape with a curvature allowing a height of the folded back portion in the penetrating direction to be larger than a total height of the flat plate member and the second plate, and the tip end of the crimping piece may be in elastic contact with the second plate from a higher position than the second plate.

According to the above configuration, the folded back portion of the crimping piece of the first plate of the shield shell is in the arc having curvature causing a diameter thereof to be larger than the total height of the flat plate member and the second plate piled on each other. Thus, the tip end of the crimping piece elastically contacts the second plate from the higher position than the second plate.

This can increase a repulsive force that can be accumulated in the crimping piece elastically contacting the second plate and can increase a crimping force of the crimping piece against the second plate. Accordingly, the developed portion of the shield member can be held by and between the flat plate member and the second plate firmly, and the shield member can be fixed to the shield shell firmly.

A method of manufacturing the shield unit in accordance with some embodiments includes: pressing the second plate toward the flat plate member by a presser member with the developed portion of the shield member being interposed between the flat plate member and the second plate of the shield shell; while moving a die closer to the flat plate member, causing the crimping piece to contact a tapered surface of the die with a position of the crimping piece contacting the tapered surface sequentially changed from the tip end of the crimping piece to a side of the crimping piece towards the outer circumferential edge of the flat plate member, and sequentially folding back parts of the crimping piece contacting the tapered surface inward along the tapered surface; and bringing the tip end of the crimping piece into pressure contact with the second plate by further moving the die closer to the flat plate member and folding back inward a part of the crimping piece contacting the tapered surface with the tip end of the crimping piece being in contact with the second plate and the presser member thereby crimping and fixing the second plate to the one surface of the flat plate member by the crimping piece.

According to the above configuration, the die is moved closer to the flat plate member, and the crimping piece is sequentially folded back inward from a side on which the tip end is provided by the tapered surface of the die. Subsequently, when the tip end of the crimping piece contacts the presser member and the second plate, and further movement thereof is regulated by the presser member and the second plate, the part of the crimping piece that has contacted the tapered surface subsequently is continuously folded back inward. Consequently, the tip end of the crimping piece is brought into pressure contact with the second plate, and the second plate is crimped and fixed to the flat plate member firmly.

Consequently, it is not necessary to provide the shield shell with a tubular portion for connecting the shield member and to use an annular member such as a swage ring for attaching the shield member to the tubular portion of the shield shell. Accordingly, it is possible to manufacture the shield unit in which, in attaching the shield member to the shield shell, the developed portion, which is an end portion of the shield member, is attached and fixed to the shield shell with inexpensive parts and a simple manufacturing process.

DETAILED DESCRIPTION

Figure 1:
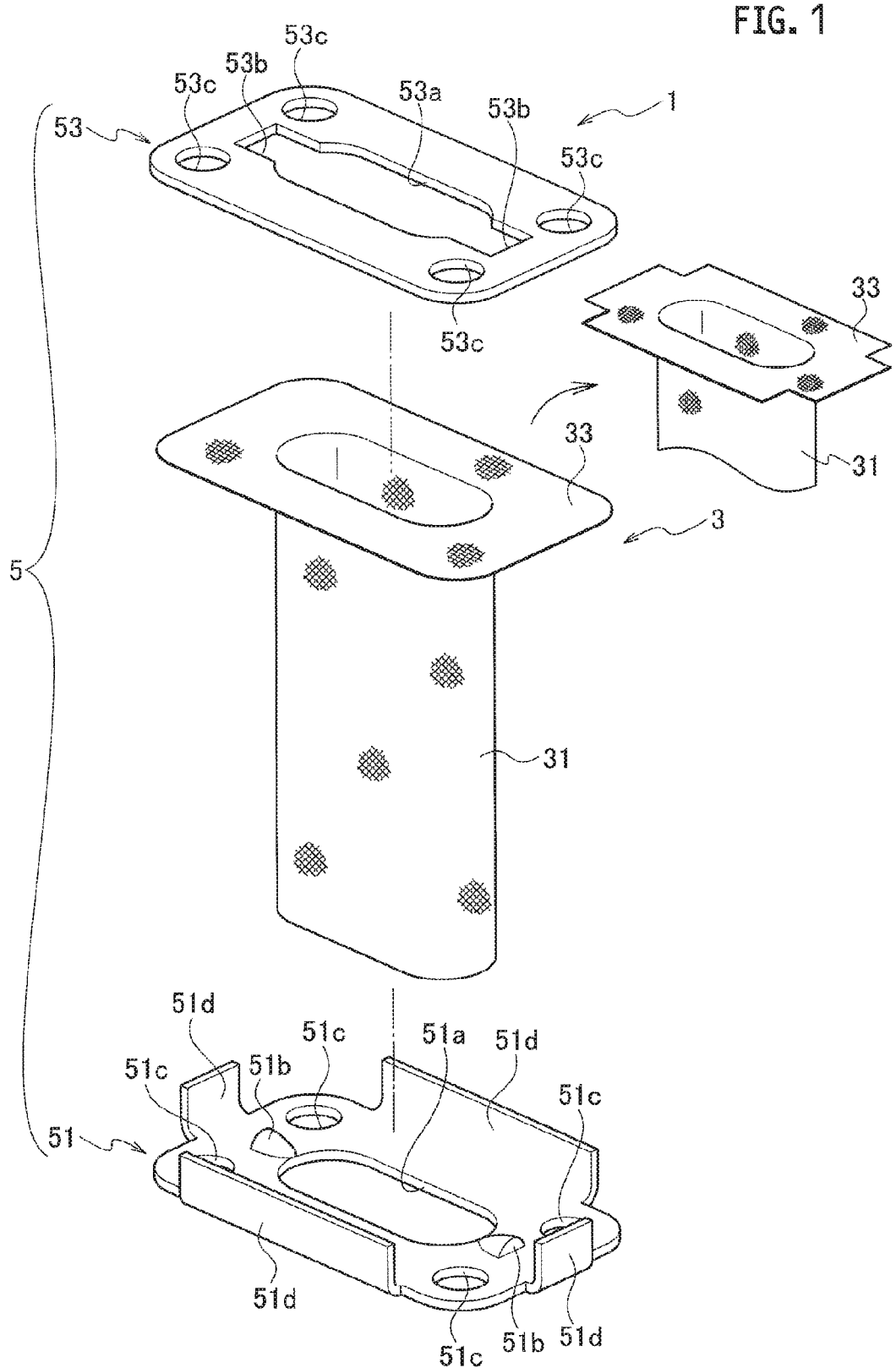
FIG. 1 is an exploded perspective view illustrating a shield unit according to an embodiment of the present invention.

In the following, a shield unit 1 according to an embodiment of the present invention will be described in detail with reference to the drawings. In the following figures, similar or identical components are shown with similar or identical reference numerals. It is to be noted that the figures are schematic, and that a ratio of each dimension differs from the actual one.

Accordingly, specific dimensions shall be determined in consideration of the following description. Also, among the figures, mutual relationship and ratios in terms of dimensions may partially differ from the actual ones.

FIG. 1 is an exploded perspective view illustrating the shield unit 1. The shield unit 1 is used to cover an electric cable bundle including a plurality of electric cables not illustrated) to constitute a shield cable (not illustrated). The shield unit 1 includes a tubular shield member 3 covering the not-illustrated electric cable bundle and made of a metallic braided wire such as aluminum and copper and a metallic: shield shell 5 connected to the shield member 3. The shield shell 5 includes first and second plates 51 and 53 as a pair.

The first plate 51 is formed in an approximately rectangular flat plate shape. At the center of the first plate 51, an elongated-hole-shaped through hole 51a is formed to cause the shield member 3 to pass therethrough. At both sides of the through hole 51a in a longitudinal direction thereof in the first plate 51, retaining pieces 51b are provided to project, respectively.

At four corners of the first plate 51, insertion holes 51c for attaching screws (not illustrated) to be attached to a not-illustrated shield case are formed. From four sides of the first plate 51, crimping pieces 51d extend, respectively.

In the present embodiment, the respective crimping pieces 51d are folded 90 degrees from the four sides of the first plate 51 and are extended. However, the reason for this is for convenience of a below-mentioned crimping work of the or the crimping pieces 51d with use of dice, and without such convenience, an extending direction of each, crimping piece 51d may be another direction such as an outward direction along the flat surface of the first plate 51.

Figure 2:
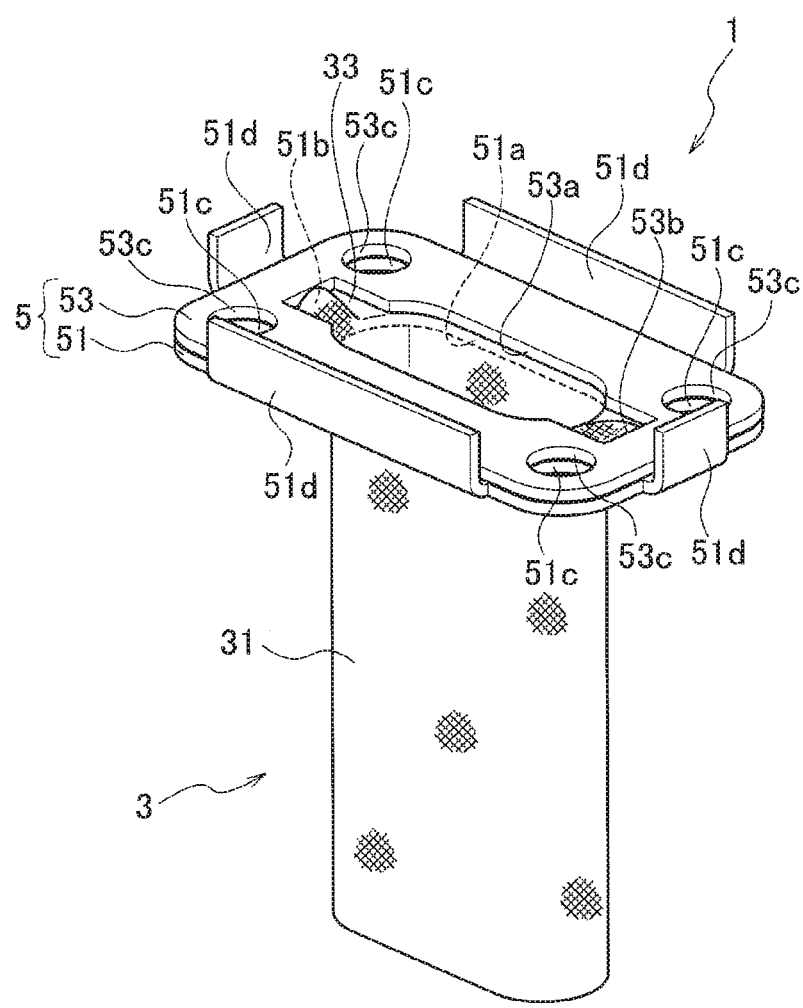
FIG. 2 is a perspective view illustrating a state in which a first plate and a second plate in FIG. 1 are piled, and in which a developed portion of a shield member is interposed therebetween.

The second plate 53 is as large as to be piled and arranged inside the respective, crimping pieces 51d of the first plate 51 and is formed in an approximately rectangular flat plate shape as illustrated in FIG. 2.

As illustrated in FIG. 1, at the center of the second plate 53, an elongated-hole-shaped through hole 53a is formed to cause the shield member 3 to pass therethrough. The through hole 53a corresponds to the through hole 51a of the first plate 51 in a state in which the second plate 53 is piled on the inside part of the respective crimping pieces 51d of the first plate 51 as illustrated in FIG. 2.

As illustrated in FIG. 1, the second plate 53 is provided with two relief holes 53b connected with both ends of the through hole 53a in a longitudinal direction of the through hole 53a. In the respective relief holes 53b, the respective retaining pieces 51b of the first plate 51 are arranged in a state in which the second plate 53 is piled on the inside part of the respective crimping pieces 51d of the first plate 51.

At four corners of the second plate 53, insertion holes 53c for the attaching screws (not illustrated) to be attached to the not-illustrated shield case are formed. The respective insertion holes 53c are formed to overlap with the respective insertion holes 51c of the first plate 51 in a state in which the second plate 53 is piled on the inside part of the respective crimping pieces 51d of the first plate 51.

Next, a procedure of connecting the shield member 3 to the shield shell 5 according to the present embodiment configured as above will be described.

First, an end portion of the shield member 3 is spread outward in a radial direction and developed in a flange shape to form a tubular portion 31 and a developed portion 33 in the shield member 3 as illustrated in FIG. 1. In other words, the shield member 3 is formed to include the tubular portion 31 and the developed portion 33 extending from the tubular portion 31 and developed outward in the radial direction of the tubular portion 31.

At this time, by slitting a terminal of the tubular portion 31 in an extending direction of the shield member 3 at several locations and developing end parts between the slits outward, the developed portion 33 having a rectangular external shape may be formed as illustrated in an upper right part in FIG. 1. In the following description, the developed portion 33 is formed by developing the end portion of the shield member 3 in the flange shape without slitting the end portion.

Subsequently, the tubular portion 31 is inserted into the through hole 51a from one surface of the first plate 51 on which the retaining pieces 51b are provided to project, the developed portion 33 is arranged on the inside part of the respective crimping pieces 51d of the first plate 51, and the second plate 53 is piled over the developed portion 33. This brings a state in FIG. 2, in which the first plate 51 and the second plate 53 overlap with each other with the developed portion 33 of the shield member 3 interposed therebetween.

Subsequently, the developed portion 33 of the shield member 3 is interposed between the first plate 51 and the second plate 53 piled on the first plate 51. With use of a pressing machine 100 illustrated in FIG. 3, the respective crimping pieces 51d of the first plate 51 are subject to a hemming (folding back) process to crimp and fix the second plate 53 to the first plate 51 by means of the folded back crimping pieces 51d. The pressing machine 100 includes a lower die 110 and an upper die 120 arranged over the lower die 110 to be movable vertically (dice).

The lower die 110 has a recess ill on an upper surface thereof opposed to the upper die 120. On the recess 111, the first plate 51 on which the second plate 53 is piled is mounted with tip ends of the respective crimping pieces 51d facing upward. The first and second plates 51 and 53 mounted on the recess 111 are positioned against the recess ill with positioning bosses 112 erecting on the recess 111 inserted in the respective insertion holes 51c and 53c of the first and second plates 51 and 53, respectively.

The lower die 110 is provided with a relief groove 113 communicated with the recess 111. The relief groove 113 is opened to two surfaces, that is, an upper surface and a side surface of the lower die 110. In the relief groove 113 is housed the tubular portion 31 of the shield member 3 in which the developed portion 33 is interposed between the first and second plates 51 and 53 mounted on the recess 111 to avoid interruption at the time of the pressing operation.

The upper die 120 has on a lower surface thereof opposed to the lower die 110 a recess 121 opposed to the recess 111 of the lower die 110 in the recess 121, a plate presser 122 (a presser member) is housed to be movable vertically. The vertical movement range of the plate presser 122 in the recess 121 is regulated by a regulation screw 123. Also, the plate presser 122 is biased in a direction of projecting from the recess 121 by a coil spring 124 interposed between the plate presser 122 and the recess 121.

The plate presser 122 has at a tip end thereof a rectangular pressing surface and presses the second plate 53 in the recess 111 of the lower die 110 toward the first plate 51 by means of this pressing surface at the time of the pressing operation. Meanwhile, the plate presser 122 is provided with relief holes (not illustrated) for avoiding interference with the positioning bosses 112 of the lower die 110 at the time of the pressing operation.

On the lower surface of the upper die 120, folding guide portions 125 are formed along four sides of a rectangular opening of the recess 121. Each folding guide portion 125 corresponds to each crimping piece 51d of the first plate mounted on the recess 111 of the lower die 110. Also, each folding guide portion 125 is provided, at a part thereof contacting a tip end 51f of each crimping piece 51d at the time of the pressing operation of each folding guide portion 125, with a tapered surface 126. The tapered surface 126 is inclined so that the depth from the lower surface of the upper die 120 may be larger as the tapered surface 126 is closer to the recess 121.

Figure 4A:
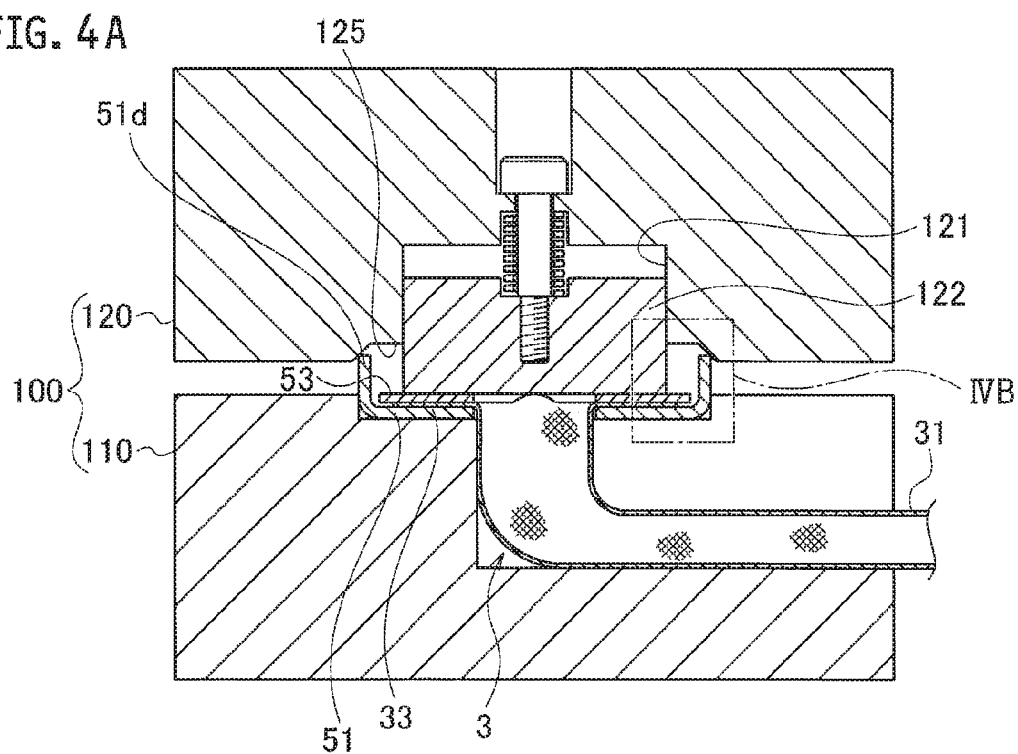
FIG. 4A is a cross-sectional view illustrating a first step of a crimping and fixing operation of the second plate to the first plate by means of the pressing machine in FIG. 3.
Figure 4B:
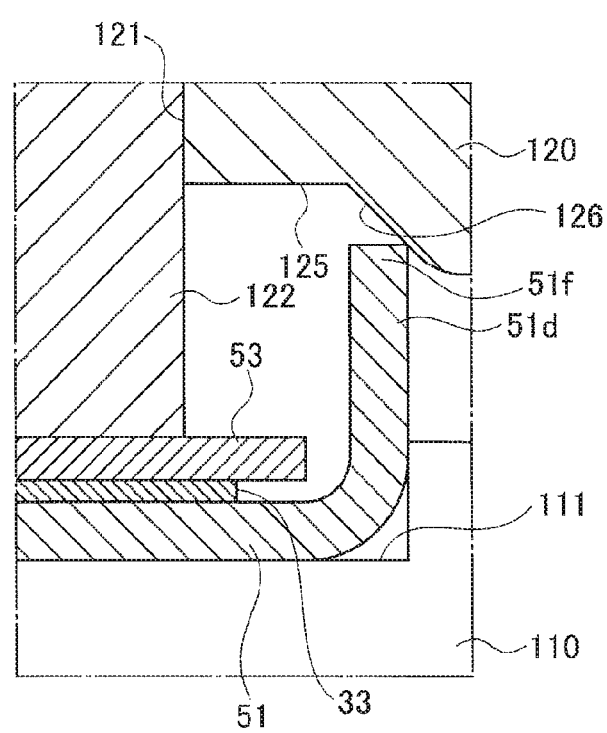
FIG. 4B is an enlarged cross-sectional view of the part IVB in FIG. 4A.

After the first plate 51 on which the second plate 53 is piled with the developed portion 33 of the shield member 3 interposed therebetween has mounted on the recess 111 of the lower die 110, the upper die 120 is lowered from an upper side of the lower die 110 as illustrated in FIG. 4A. Subsequently, as illustrated in FIG. 4B, which is an enlarged view of the part IVB in FIG. 4A, the tip end 51f of each crimping piece 51d of the first plate 51 is caused to contact the tapered surface 126 of each corresponding folding guide portion 125 of the upper die 120.

In this state, as illustrated in FIG. 4A, the pressing surface of the plate presser 122 contacts the second plate 53 and presses the second plate 53 toward the first plate 51 by means of the elastic force of the coil spring 124 (a pressing step).

Figure 5A:
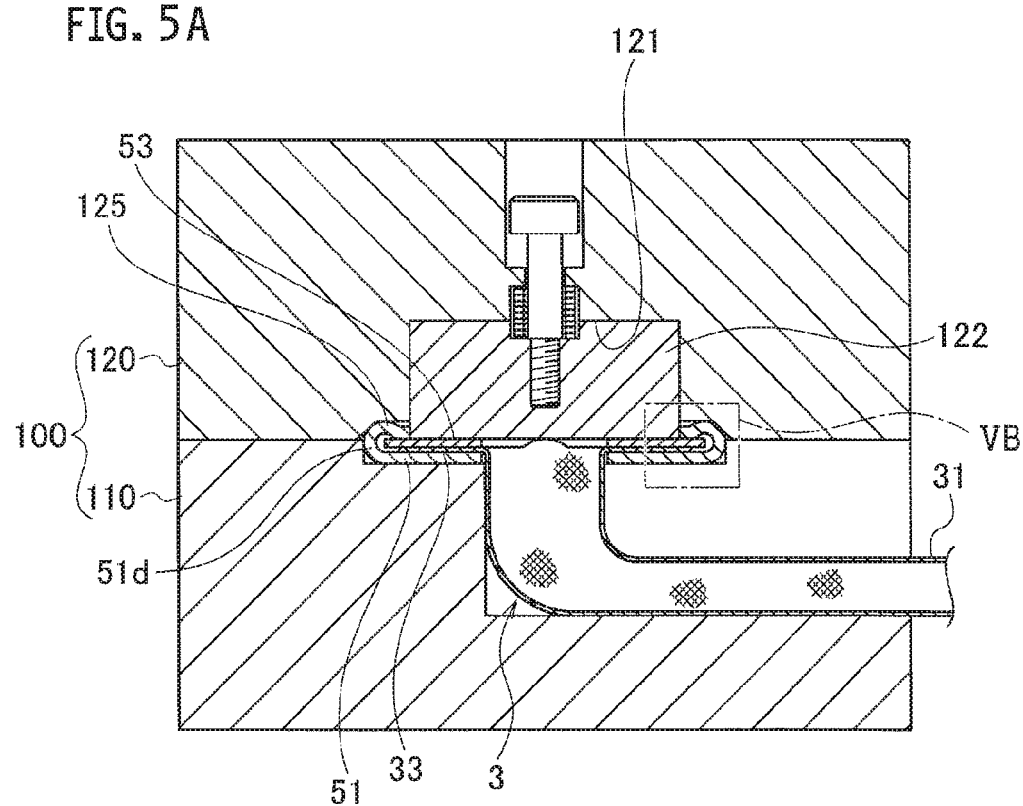
FIG. 5A is a cross-sectional view illustrating a second step of the crimping and fixing operation of the second plate to the first plate by means of the pressing machine in FIG. 3.
Figure 5B:
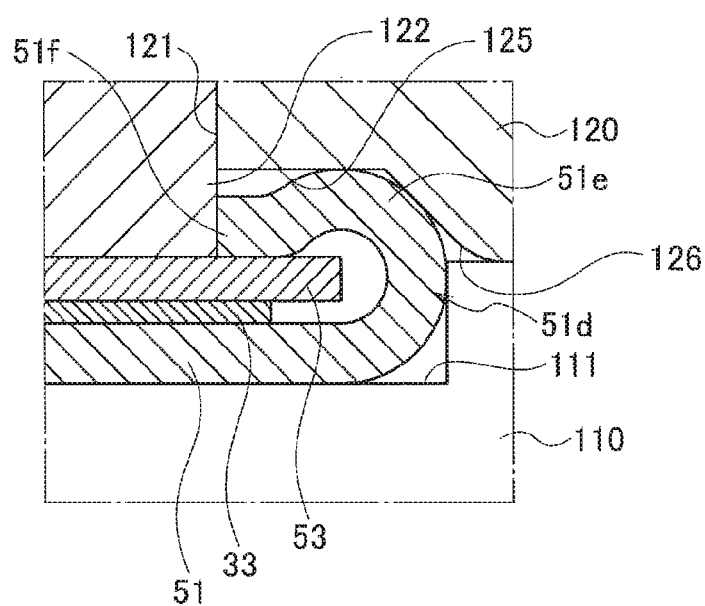
FIG. 5B is an enlarged cross-sectional view of the part VB in FIG. 5A.

Subsequently, as illustrated in FIG. 5A, the upper die 120 is further lowered until the lower surface of the upper die 120 contacts the upper surface of the lower die 110. Each crimping piece 516 of the first plate 51 sequentially contacts the tapered surface 126 of the folding guide portion 125 from a side of the tip end 511 toward a side of the first plate 51. By doing so, parts of each crimping piece 51d contacting the tapered surface 126 are folded back inward in an arc along the tapered surface 126 as illustrated in FIG. 5B, which is an enlarged view of the part VB in FIG. 5A (a folding back step).

Figure 6:
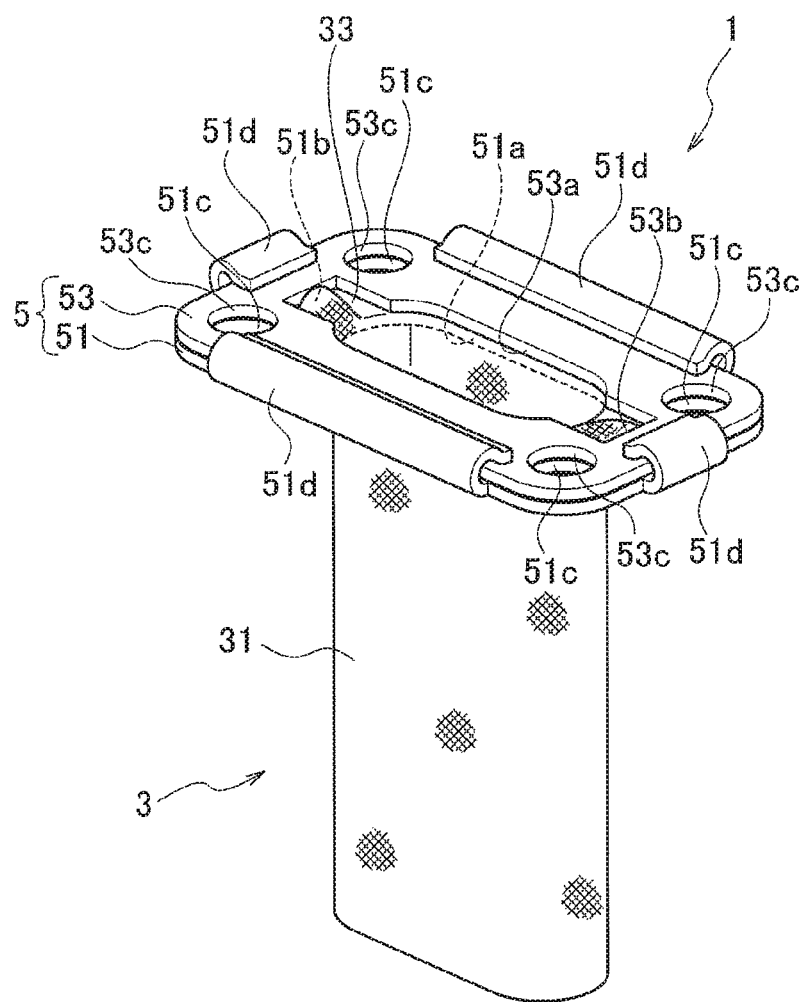
FIG. 6 is a perspective view of the shield unit in which the shield member has been connected to a shield shell by crimping and fixing of the second plate to the first plate.

The tip end 51f extending from an arc-like folded back portion 51e of each crimping piece 51d is brought into pressure contact with the second plate 53 and touches a side surface of the plate presser 122. This brings a state in which, each crimping piece 51d has crimped and fixed the second plate 53 to the first plate 51 as illustrated in FIG. 6 (a crimping step).

Specifically, the tip end 51f of each crimping piece 51d contacts a surface of the second plate 53 and the side surface of the plate presser 122, and further movement thereof in directions of approaching the respective surfaces is regulated. In this state, when the upper die 120 is lowered to further approach the first plate 51, and a part of each crimping piece 51d contacting the tapered surface 126 is folded back inward by the tapered surface 126, the tip end 51f of each crimping piece 51d is brought into pressure contact with the second plate 53, and the second plate 53 is firmly crimped and fixed to the first plate 51 by the crimping piece 51d.

In this state, an inside of the shield member 3 communicates with an outside of the shield shell 5 via the through hole 53a of the second plate 53. Accordingly, by attaching a side of the shield shell 5 on which the second plate 53 is provided to the not-illustrated shield case, the shield cable (not illustrated) in the shield member 3 can be connected to a cable (not illustrated) of the shield case via a not-illustrated connector.

Also, when the second plate 53 is crimped and fixed to the first plate 51, a part of the developed portion 33 of the shield member 3 that has risen due to overlap with each retaining piece 51b of the first plate 51 is thrust by a rim portion of each corresponding relief hole 53b of the second plate 53 and gets in a state of being retained by each retaining piece 51b. Due to this retention, the developed portion 33 of the shield member 3 is held by and between the first and second plates 51 and 53 not to come off of a space even when a tensile force is applied to the tubular portion 31.

Figure 7:
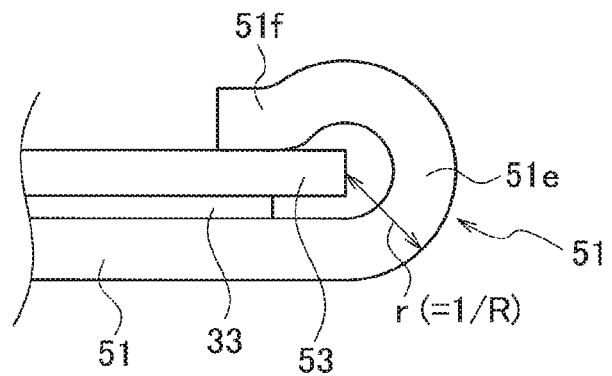
FIG. 7 is a schematic view illustrating positional relationship between a folded back portion and a tip end of the crimping piece in the shield unit in FIG. 6.

As a result of the pressing operation with use of the pressing machine 100, the folded back portion 51e of the crimping piece 51d is in an arc having curvature of R is curvature radius of r) causing a diameter thereof to be larger than a total height of the piled first and second plates 51 and 53 as illustrated in FIG. 7.

According to the shield unit 1, in connecting the shield member 3 to the shield shell 5, it is not necessary as in a conventional case to provide the shield shell 5 with a tubular portion for connecting the shield member 3 and to use an annular member such as a swage ring for attaching the shield member 3 to the tubular portion. Accordingly, parts and portions requiring drawing can be dispensed with, and the developed portion, which is the end portion of the shield member 3, can be attached and fixed to the shield shell 5 with inexpensive parts and a simple manufacturing process.

Also, according to the shield unit 1, the folded back portion 51e of the crimping piece 51d of the first plate 51 is in the arc having curvature of R causing the diameter thereof to be larger than the total height of the piled first plate 51 and second plate 53. Thus, the tip end 51f of the crimping piece 51d elastically contacts the second plate 53 plied on the first plate 51 from a higher position than the second plate 53. This can increase the repulsive force that can be accumulated in the crimping piece 51d elastically contacting the second plate 53 and can increase a crimping force of the crimping piece 51d against the second plate 53. Accordingly, the developed portion 33 of the shield member 3 can be held by and between the first plate 51 and the second plate 53 firmly, and the shield member 3 can be fixed to the shield shell 5 firmly.

Meanwhile, the hemming process may be performed so that the folded back portion 51e of the crimping piece 51d may be brought into close contact with an end portion of the second plate 53.

Also, the configuration in which the developed portion 33 of the shield member 3 is retained by the retaining piece 51b of the first plate 51 and the relief hole 53b of the second plate 53 may be omitted.

Figure 8:
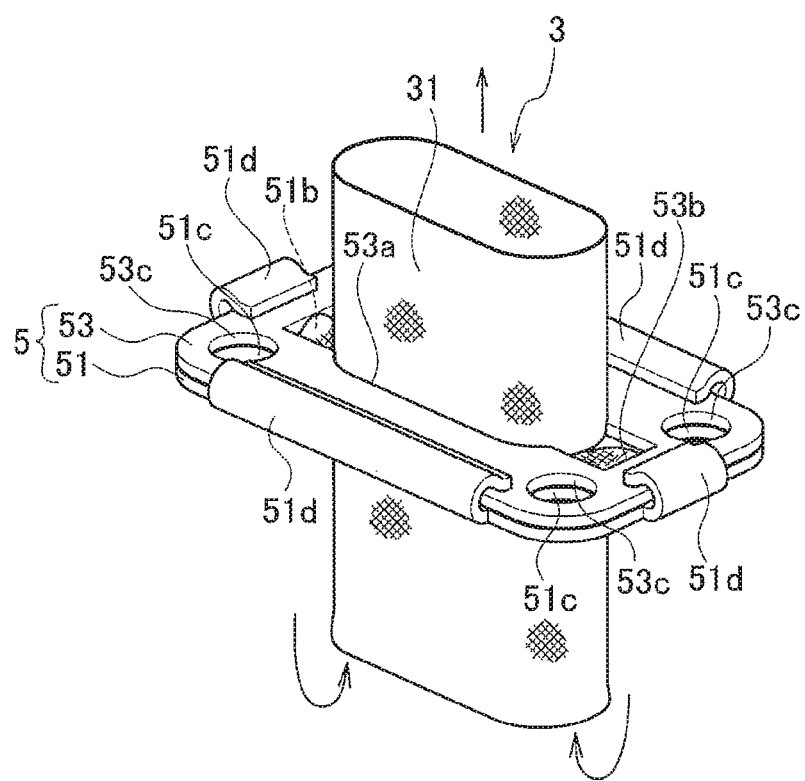
FIG. 8 is a perspective view of the shield unit illustrating a state of a step of folding back a tubular portion of the shield member in FIG. 6 inward and pulling a tip end thereof out of the shield shell via a through hole of the second plate.
Figure 9:
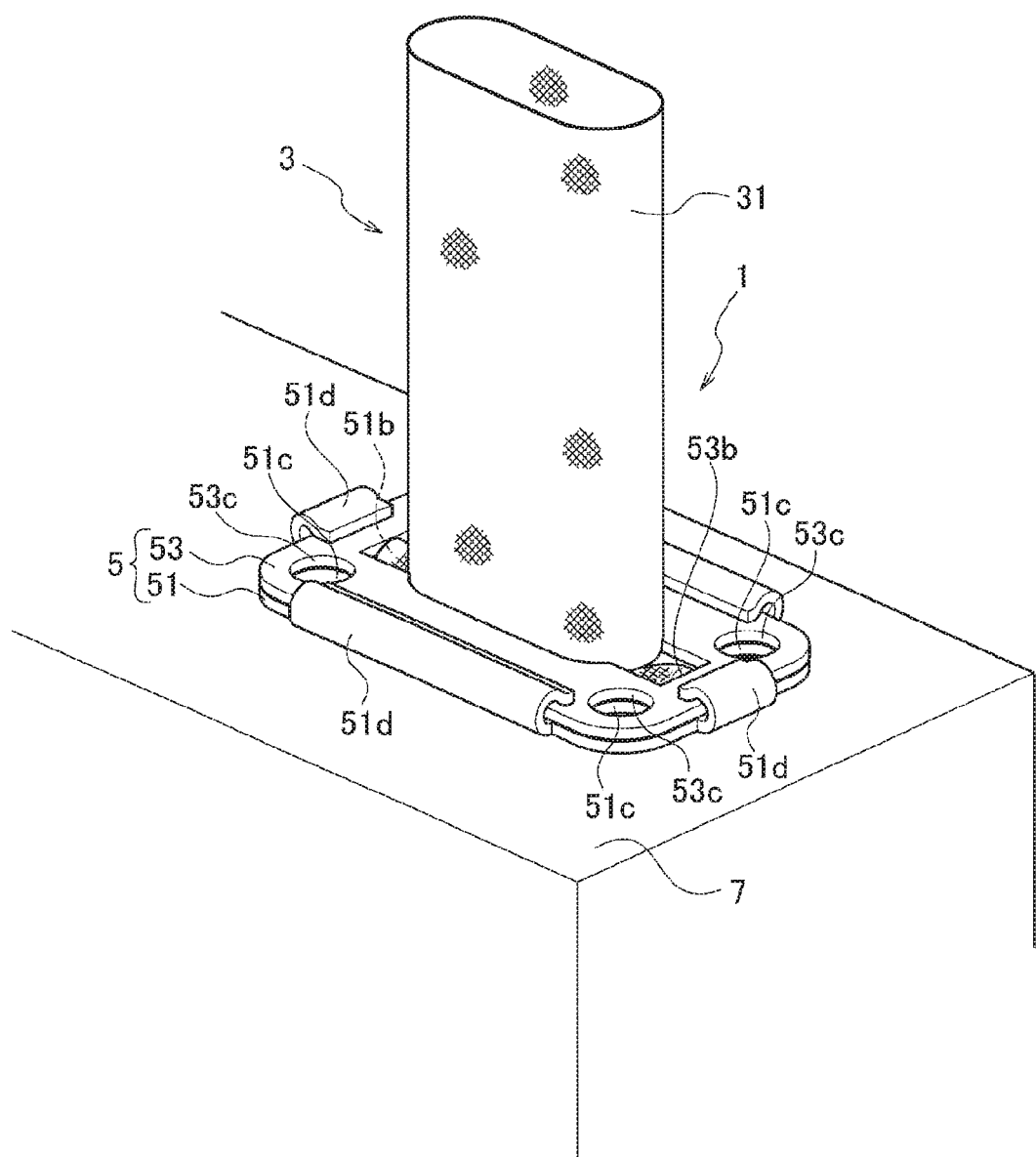
FIG. 9 is a perspective view illustrating the shield unit in a completed state, in which the shield, member in FIG. 8 has entirely been pulled to a side of the second plate.

Next, a case in which a side of the shield shell 5 on which the first plate 51 is provided is attached to the shield case will be described with reference to FIGS. 8 to 10. In this case, the tubular portion 31 of the shield member 3 connected to the shield shell 5 in the state illustrated in FIG. 6 is turned back inward as illustrated in a perspective view in FIG. 8 and is pulled out through the through hole 53a to the side of the second plate 53 to put the shield unit 1 into a state illustrated in a perspective view in FIG. 9. Subsequently, the first plate 51 is mounted on a shield case 7, and the shield shell 5 is fixed to the shield case 7 by means of not-illustrated bolts passing through the respective insertion holes 51c and 53c of the piled first plate 51 and second plate 53.

Meanwhile, a procedure of assembling the shield unit 1 to be performed before attaching and fixing the shield unit 1 to the shield case 7 may be a following procedure. First, in the state in FIG. 1, the tubular portion 31 of the shield member 3 is inserted into the through hole 53a of the second plate 53, the second plate 53 is arranged in the inside part of the respective crimping pieces 51d of the first plate 51, and the developed portion 33 is interposed between the first plate 51 and the second plate 53. As a result, the tubular portion 31 of the shield member 3 extends to the side of the second plate 53 as illustrated in FIG. 9, and the respective crimping pieces 51d are in the states before the second plate 53 is crimped and fixed to the first plate 51 as illustrated in FIG. 2.

Figure 3:
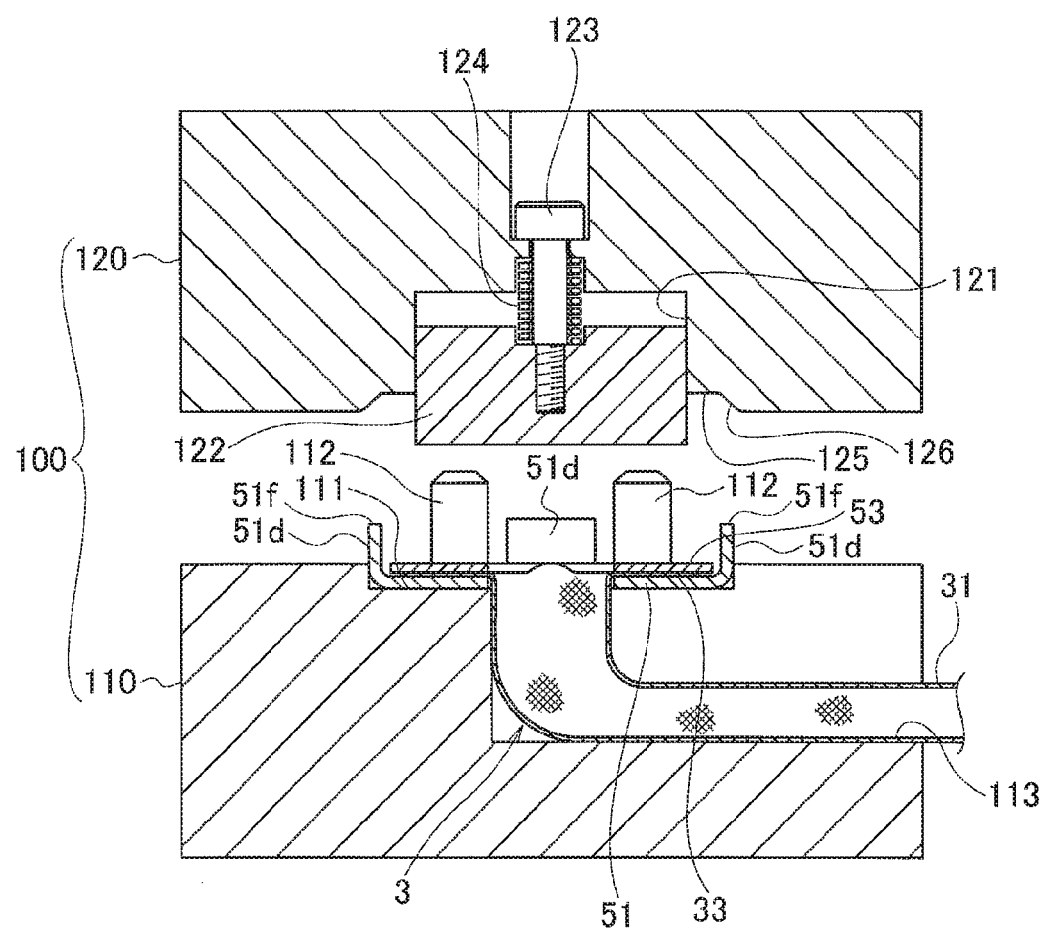
FIG. 3 is a cross-sectional view describing a pressing operation by means of a pressing machine for crimping and fixing the second plate by means of crimping pieces of the first plate in FIG. 2.

Subsequently, with use of the pressing machine 100 illustrated in FIG. 3, the respective crimping pieces 51d of the first plate 51 are subject to the hemming (folding back) process to crimp and fix the second plate 53 to the first plate 51 by means of the folded back crimping pieces 51d in this case, since the tubular portion 31 of the shield member 3 extends to the side of the second plate 53, the relief groove 113 of the pressing machine 100 illustrated in FIG. 3 needs to be provided in the upper die 120, not in the lower die 110, so as to avoid interference with the plate presser 122 and the vertical movement mechanism thereof (the regulation screw 123 and the coil spring 124).

Subsequently, according to the procedure in FIGS. 4A, 4B, 5A, and 5B, the plate presser 122 presses the second plate 53 toward the first plate 51 (the pressing step), and each crimping piece 51d of the first plate 51 is folded back inward in the arc along the tapered surface 126 of the upper die 120 (the folding back step). Subsequently, each crimping piece 51d crimps and fixes the second plate 53 to the first plate 51 (the crimping step) to bring the state illustrated in FIG. 9.

Figure 10:
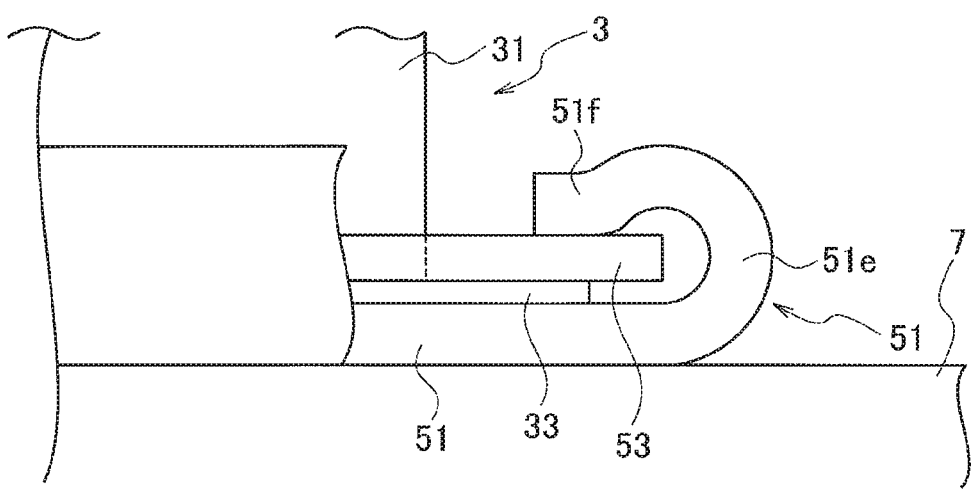
FIG. 10 is a schematic view with partial cutaway of a main part of a state in which the first plate of the shield unit in FIG. 9 is attached to an attaching surface of a shield case.

In this case as well, as illustrated in a schematic view in FIG. 10, the folded back portion 51e of the crimping piece 51d of the first plate 51 is formed in the arc having curvature of R causing the diameter thereof to be larger than the total height of the piled first plate 51 and second plate 53. Thus, the tip end 51f of the crimping piece 51d of the first plate 51 elastically contacts the second plate 53 from the higher position than the second plate 53, which can increase the repulsive force that can be accumulated in the crimping piece 51d. This can increase the crimping force of the crimping piece 51d against the second plate 53, can hold the developed portion 33 of the shield member 3 by and between the first plate 51 and the second plate 53 firmly, and can fix the shield member 3 to the shield shell 5 firmly.

It is to be noted that the number and arrangement of the crimping pieces 51d are not limited to those described in the present embodiment and are arbitrary as long as the second plate 52 can be crimped and fixed to the first plate 51.

In this way, the present invention includes various embodiments not described above. Therefore, the scope of the present invention is determined only by the invention identification matters according to claims reasonable from the foregoing description.

What is claimed is:

1. A shield unit comprising:
   a tubular shield member having a tubular portion and a developed portion extending from the tubular portion and developed outward in a radial direction of the tubular portion; and
   a shield shell connected to the developed portion and comprising a first plate and a flat second plate, wherein
   the first plate comprises: a flat plate member having a first through hole at a center of the flat plate; and at least one crimping piece extending from an outer circumferential edge of the flat plate member and folded back to one surface of the flat plate member in a penetrating direction of the first through hole,
   the second plate has a second through hole at a center of the second plate,
   the developed portion is held by and between the flat plate member and the second plate piled with the first through hole and the second through hole being aligned,
   the second plate piled on the flat plate member with the developed portion held by and between the flat plate member and the second plate is crimped and fixed to the one surface of the flat plate member by a tip end of the crimping piece, and
   the tubular portion passes through the first through hole or the second through hole and extends out of the shield shell.

2. The shield unit according to claim 1, wherein
   a folded back portion of the crimping piece extending from the tip end has an arc shape with a curvature allowing a height of the folded back portion in the penetrating direction to be larger than a total height of the flat plate member and the second plate, and
   the tip end of the crimping piece is in elastic contact with the second plate from a higher position than the second plate.

3. A method of manufacturing a shield unit,
   the shield unit comprising:
      a tubular shield member having a tubular portion and a developed portion extending from the tubular portion and developed outward in a radial direction of the tubular portion; and
      a shield shell connected to the developed portion and comprising a first plate and a flat second plate, wherein
      the first plate comprises: a flat plate member having a first through hole at a center of the flat plate; and at least one crimping piece extending from an outer circumferential edge of the flat plate member and folded back to one surface of the flat plate member in a penetrating direction of the first through hole,
      the second plate has a second through hole at a center of the second plate,
      the developed portion is held by and between the flat plate member and the second plate piled with the first through hole and the second through hole being aligned,
      the second plate piled on the flat plate member with the developed portion held by and between the flat plate member and the second plate is crimped and fixed to the one surface of the flat plate member by a tip end of the crimping piece, and
      the tubular portion passes through the first through hole or the second through hole and extends out of the shield shell,
   the method comprising:
      pressing the second plate toward the flat plate member by a presser member with the developed port on of the shield member being interposed between the flat plate member and the second plate of the shield shell;
      while moving a die closer to the flat plate member, causing the crimping piece to contact a tapered surface of the die with a position of the crimping piece contacting the tapered surface sequentially changed from the tip end of the crimping piece to a side of the crimping piece towards the outer circumferential edge of the flat plate member, and sequentially folding back parts of the crimping piece contacting the tapered surface inward along the tapered surface; and
      bringing the tip end of the crimping piece into pressure contact with the second plate by further moving the die closer to the flat plate member and folding back inward a part of the crimping piece contacting the tapered surface with the tip end of the crimping piece being in contact with the second plate and the presser member thereby crimping and fixing the second plate to the one surface of the flat plate member by the crimping piece.

4. The method according to claim 3, wherein
   when sequentially folding back the parts of the crimping piece contacting the tapered surface inward along the tapered surface, forming a folded back portion of the crimping piece extending from the tip end into an arc shape with a curvature allowing a height of the folded back portion in the penetrating direction to be larger than a total height of the flat plate member and the second plate, and
   when bringing the tip end of the crimping piece into pressure contact with the second plate, bringing the tip end of the crimping piece into elastic contact with the second plate from a higher position than the second plate.

* * * * *